(12) United States Patent
Li et al.

(10) Patent No.: US 6,208,183 B1
(45) Date of Patent: Mar. 27, 2001

(54) GATED DELAY-LOCKED LOOP FOR CLOCK GENERATION APPLICATIONS

(75) Inventors: Larry B. Li, Irvine; Akbar Ali, Garden Grove; Matteo Conta, Irvine, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/302,755

(22) Filed: Apr. 30, 1999

(51) Int. Cl.[7] .................................................. H03L 7/00
(52) U.S. Cl. .......................... 327/161; 327/158; 327/244; 327/248; 327/277; 327/299
(58) Field of Search .................................... 327/156, 158, 327/161, 244, 248, 277, 284, 291, 299; 331/108, 111, 140, 153, 173

(56) References Cited

U.S. PATENT DOCUMENTS

| | | | | |
|---|---|---|---|---|
| 4,845,390 | * | 7/1989 | Chan ..................................... | 327/278 |
| 5,463,337 | * | 10/1995 | Leonowich ............................ | 327/158 |
| 5,727,037 | * | 3/1998 | Maneatis ............................... | 375/376 |
| 5,744,991 | * | 4/1998 | Jefferson et al. ..................... | 327/158 |
| 5,771,264 | * | 6/1998 | Lane ...................................... | 375/376 |
| 5,777,501 | * | 7/1998 | Abouseido ............................ | 327/274 |
| 5,781,055 | * | 7/1998 | Bhagwan ............................... | 327/270 |
| 5,790,612 | * | 8/1998 | Chengson et al. .................... | 375/373 |
| 5,815,016 | * | 9/1998 | Erickson ................................ | 327/158 |
| 5,880,612 | * | 3/1999 | Kim ........................................ | 327/158 |
| 6,011,822 | * | 1/2000 | Dreyer ................................... | 375/376 |
| 6,028,903 | * | 2/2000 | Drost ..................................... | 375/360 |

* cited by examiner

*Primary Examiner*—Kenneth B. Wells
*Assistant Examiner*—Cassandra Cox
(74) *Attorney, Agent, or Firm*—Lyon & Lyon LLP

(57) ABSTRACT

A gated-delay locked loop that generates an output clock in phase with and having a frequency which is an integer multiple of the frequency of a reference clock. The gated delay-locked loop includes a voltage-controlled gated oscillator having first and second serially connected voltage-controlled delay elements that each introduce a time delay to produce a first delayed clock and the output clock. An S-R flip-flop receives the first delayed clock on its R-input and either the output clock or the reference clock on its S-input to produce a loop clock. The loop clock is provided to the first delay element. A multiplexer selects the reference clock as the S input to the flip-flop once every N cycles, and selects the output clock as the S input the remaining N–1 cycles. A phase detector, a charge pump and a loop filter compare the phase of the output clock to the phase of the reference clock and apply a voltage to the delay elements to correct any phase differences.

29 Claims, 8 Drawing Sheets

GATED DELAY-LOCKED LOOP FOR CLOCK GENERATION APPLICATIONS

FIELD OF THE INVENTION

The present invention relates generally to clock generation circuits and, more particularly, relates to a clock generation circuit utilizing a gated delay-locked loop architecture.

BACKGROUND OF THE INVENTION

Many electrical and computer applications and components have critical timing requirements that compel generation of periodic clock waveforms that are precisely synchronized with a reference clock waveform. A phase-locked loop ("PLL") is one type of circuit that is widely used to provide an output signal having a precisely controlled frequency that is synchronous with the frequency of a reference or input signal. Wireless communication devices, frequency synthesizers, multipliers and dividers, single and multiple clock generators, and clock recovery circuits are but a few examples of the manifold implementations of PLLs.

Frequency synthesis is a particularly common technique used to generate a high frequency clock from a lower frequency reference clock. In microprocessors, for example, an on-chip PLL can multiply the frequency of a low frequency input (off-chip) clock, typically in the range of 1 to 4 MHz, to generate a high frequency output clock, typically in the range of 10 to over 200 MHz, that is precisely synchronized with the lower frequency external clock. Another common use of PLLs is recovery of digital data from serial data streams by locking a local clock signal onto the phase and frequency of the data transitions. The local clock signal is then used to clock a flip-flop or latch receiving input from the serial data stream.

FIG. 1 is a block diagram of a typical PLL 10. PLL 10 comprises phase/frequency detector 12, charge pump 14, loop filter 16, voltage-controlled oscillator ("VCO") 18 and frequency divider 20. PLL 10 receives a reference clock signal $CLK_{REF}$ having a frequency $F_{REF}$ and generates an output clock signal $CLK_{OUT}$ having a frequency $F_{OUT}$ that is aligned to the reference clock signal in phase. The output clock frequency is typically an integer (N) multiple of the reference clock frequency; with the parameter N set by frequency divider 20. Hence, for each reference signal period, there are N output signal periods or cycles.

Phase/frequency signal detector 12 receives on its input terminals two clock signals $CLK_{REF}$ and $CLK^*_{OUT}$ ($CLK_{OUT}$, with its frequency $F_{OUT}$ divided down by frequency divider 20). In a conventional arrangement, detector 12 is a rising edge detector that compares the rising edges of the two clock signals. Based on this comparison, detector 12 generates one of three states. If the phases of the two signals are aligned, the loop is "locked". Neither the UP nor the DOWN signal is asserted and VCO 18 continues to oscillate at the same frequency. If $CLK_{REF}$ leads $CLK^*_{OUT}$, than VCO 18 is oscillating too slowly and detector 12 outputs an UP signal proportional to the phase difference between $CLK_{REF}$ and $CLK^*_{OUT}$. Conversely, if $CLK_{REF}$ lags $CLK^*_{OUT}$, than VCO 18 is oscillating too quickly and detector 12 outputs a DOWN signal proportional to the phase difference between $CLK_{REF}$ and $CLK^*_{OUT}$. The UP and DOWN signals typically take the form of pulses having a width or duration corresponding to the timing difference between the rising edges of the reference and output clock signals.

Charge pump 14 generates a current $I_{CP}$ that controls the oscillation frequency $F_{OUT}$ of VCO 18. $I_{CP}$ is dependent on the signal output by phase/frequency detector 12. If charge pump 14 receives an UP signal from detector 12, indicating that $CLK_{REF}$ leads $CLK^*_{OUT}$, $I_{CP}$ is increased. If charge pump 14 receives a DOWN signal from detector 12, indicating that $CLK_{REF}$ lags $CLK^*_{OUT}$, $I_{CP}$ is decreased. If neither an UP nor a DOWN signal is received, indicating that the clock signals are aligned, charge pump 14 does not adjust $I_{CP}$.

Loop filter 16 is positioned between charge pump 14 and VCO 18. Application of the charge pump output current $I_{CP}$ to loop filter 16 develops a voltage $V_{LF}$ across filter 16. $V_{LF}$ is applied to VCO 18 to control the frequency $F_{OUT}$ of the output clock signal. Filter 16 also removes out-of-band, interfering signals before application of $V_{LF}$ to VCO 18. A common configuration for a loop filter in a PLL is a simple single-pole, low-pass filter that can be realized with a single resistor and capacitor.

Oscillator 18 generates an oscillating output signal $CLK_{OUT}$ having a frequency $F_{OUT}$ proportional to the voltage $V_{LF}$ applied to VCO 18. Conventional voltage-controlled oscillators typically oscillate about a specific center frequency and have a relatively narrow frequency range or bandwidth. When $CLK_{REF}$ leads $CLK^*_{OUT}$, charge pump 14 increases $I_{CP}$ to develop a greater $V_{LF}$ across loop filter 16 which, in turn, causes VCO 18 to increase $F_{OUT}$. Conversely, when $CLK_{REF}$ lags $CLK^*_{OUT}$, charge pump 14 decreases $I_{CP}$ to develop a lesser $V_{LF}$ across loop filter 16 which, in turn, causes VCO 18 to decrease $F_{OUT}$. When $CLK_{REF}$ and $CLK^*_{OUT}$ are aligned, $V_{LF}$ is not adjusted, and $F_{OUT}$ is kept constant. In this state, PLL 10 is in a "locked" condition.

The output clock signal is also looped back through (in some applications) frequency divider 20. The resultant output $CLK^*_{OUT}$ is provided to phase/frequency detector 12 to facilitate the phase-locked loop operation. Frequency divider 20 facilitates comparison of the generally higher frequency output clock signal with the lower frequency reference clock signal by dividing $F_{OUT}$ by the multiplication factor N. Divider 20 may be implemented using counters, shift registers, or through other methods familiar to those of ordinary skill in the art. Thus, PLL 10 compares the reference clock phase to the output clock phase and eliminates any detected phase difference between the two by adjusting the frequency of the output clock.

As described above, phase-locked loops conventionally employ voltage-controlled oscillators to generate the output clock signal. Voltage-controlled oscillators, in turn, are often implemented in the form of ring oscillators. Ring oscillators are well known in the art and are typically comprised of an odd number of inverters connected in cascade, with the output of the last inverter in the series being connected to the input of the first inverter. Hence, the oscillator alternately generates logical ones and zeroes that propagate around the ring. Each inverter also acts as a delay element, wherein the delay of the inverter contributes to the oscillation period.

Ring oscillators are plagued by several drawbacks. Of chief concern, relative to the present invention, is the tendency of ring oscillators to accumulate a significant amount of jitter. Jitter is phase noise that is generated during PLL operation from a number of sources, including switching activity and substrate and supply noise. Each inverter generates a quantum of jitter that is transferred to successive stages. As the ring oscillator is essentially a continuous feedback loop, the jitter continuously propagates and accumulates. The jitter-per-cycle of a PLL employing a ring oscillator is expressed by the sum of the timing error contributed by each inverter weighted by the correction provided by the loop. The z-domain transfer function, $\Theta_{out}(z)$, for the phase error of a PLL employing a ring oscillator may be represented as:

$$\Theta_{out}(z) = \frac{\Theta_n(z)}{1 + K_d K_{vco} Z_F(z) z^{-1}};$$

where $K_d$ is the gain of the phase detector, $K_{VCO}$ is the gain of the VCO, and $Z_F(z)$ is the z-domain transfer function of the loop filter. Assuming a first order loop filter transfer function is used, the z-domain transfer function for phase error becomes:

$$\Theta_{out}(z) = \frac{1 - z^{-1}}{1 - (1 - \varepsilon)z^{-1}} \Theta_n(z);$$

where $\varepsilon = K_d K_{VCO} aT$ and is smaller than one, wherein a is the DC gain of loop filter 16 and T is the period of the input reference signal $$\left(\frac{1}{F_{REF}}\right),$$

and $\Theta_n(z)$ is the z-transform of the phase of the input reference signal.

The phase jitter of a ring oscillator can be modeled as a sequence of unit step phase jumps with random magnitude. A single-phase jump at time nT can be expressed in the z-domain as:

$$\Theta_n(z) = \frac{2\pi \Delta t_n}{T(1 - z^{-1})}$$

Hence, the resulting phase error in the z-domain is:

$$\Theta_{out}(z) = \frac{2\pi \Delta t_n}{T(1 - (1 - \varepsilon)z^{-1})}$$

The square of the phase error can be written as:

$$\Theta_{out}^2(nT) = \left(\frac{2\pi}{T}\right)^2 \frac{\Delta t_n^2}{\varepsilon(2 - \varepsilon)}$$

The r.m.s. of the phase error, which is a measure of the phase jitter in the output of the VCO due to noise is:

$$\sqrt{\Theta_{out}^2(nT)} = \sqrt{\frac{1}{\varepsilon(2 - \varepsilon)}} \cdot \frac{2\pi \Delta t}{T} = \alpha \cdot \frac{2\pi \Delta t}{T};$$

where the accumulation factor, $\alpha$, is $$\frac{2\pi \Delta t}{T}.$$

The PLL bandwidth can be expressed as $$\omega_L \approx K_{VCO} K_d a, \text{ so:}$$

$$\varepsilon = \frac{\omega_L}{\omega_{REF}};$$

where $\omega_{REF}$ is the reference or comparison frequency $F_{REF}$ of the phase detector.

FIG. 7, which plots the accumulation factor $\alpha$ vs. the loop bandwidth/reference frequency ratio $\varepsilon$, demonstrates the jitter accumulation demonstrated by a PLL employing a ring oscillator over a range of bandwidths. The figure demonstrates that reducing loop bandwidth can reduce the accumulation factor. The problem is that there are limits to the extent to which loop bandwidth can be reduced and still maintain loop stability. In one implementation example, loop stability is maintained if the loop bandwidth is above about 100% of the reference frequency. Therefore, decreasing PLL bandwidth is at best a limited option for reducing jitter.

In view of the above, there is a need for a clock generation circuit that overcomes the disadvantages of the prior art.

SUMMARY OF THE INVENTION

In accordance with the purpose of the invention as broadly described herein, there is provided a clock generation circuit that exhibits low jitter performance as well as frequency synthesis capability.

In one embodiment of the present invention, a gated delay-locked loop is provided. It receives a reference clock having a frequency $F_{REF}$ and generates an output clock having a frequency $F_{OUT} = N \cdot F_{REF}$ that is synchronized in phase with the reference clock. It comprises a gated oscillator having at least one delay element configured in a feedback loop that introduces a time delay $T_{del}$ to produce a delayed clock. A switch is responsive to a gating signal to selectively apply either a clock derived from the delayed clock or the reference clock to the feedback loop. The gated delay-locked loop further comprises a phase comparator for comparing the phase of a clock derived from the output clock to the phase of the reference clock and adjusting the time delay introduced by the delay elements to correct any detected phase difference.

In one implementation, a first delay element generates a first delayed clock and a second delay element generates the output clock. A voltage generated by the phase comparator controls the delay elements. The switch comprises a multiplexer that receives the reference clock and the output clock as inputs and is responsive to a gating pulse to supply one of these clocks to the S input of an S-R flip-flop. The gating pulse is applied to the multiplexer once every N cycles of the output clock to cause the multiplexer to provide the reference clock to the flip-flop. The multiplexer supplies the output clock to the flip-flop the remaining N−1 cycles. The flip-flop receives the first delayed clock on its R input and derives a loop clock that is coupled to the input of the first delay element.

In a first method according to the present invention, an output clock having an output frequency $F_{OUT}$ equal to an integer N multiplied by a reference frequency $F_{REF}$ of a reference clock is generated. The output clock has N cycles per cycle of the reference clock. The method includes the steps of:

(a) determining a current cycle of the output clock;
(b) deriving a loop clock from the output clock if the current cycle is other than the Nth cycle;
(c) deriving a loop clock from the reference clock if the current cycle is the Nth cycle;
(d) delaying the loop clock;
(e) deriving the output clock from the delayed loop clock;
(f) incrementing the current cycle; and
(g) repeating the method from step (a).

In a second method according to the present invention, an output clock having an output frequency $F_{OUT}$ equal to an integer N multiplied by a reference frequency $F_{REF}$ of a reference clock is generated. The method includes the steps of:

(a) determining a current cycle of the output clock;
(b) providing the output clock to a frequency adder if the current cycle is other than the Nth cycle;
(c) providing the reference clock to the frequency adder if the current cycle is the Nth cycle;
(d) providing a delayed loop clock to the frequency adder;
(e) deriving the loop clock from the delayed loop clock and either the output clock or the reference clock;
(f) delaying the loop clock to obtain the delayed loop clock;
(g) delaying the delayed loop clock to obtain the output clock;
(h) incrementing the current cycle; and
(i) repeating the method from step (a).

In another embodiment of the present invention, a gated oscillator is provided. The oscillator receives a reference clock having a frequency $F_{REF}$ and generates an output clock having a frequency $F_{OUT}=N \cdot F_{REF}$ that is synchronized in phase with the reference clock. It comprises a switch that is responsive to a gating signal to switch between the reference clock and the output clock, a frequency adder coupled to the output of the switch that derives a loop clock from the clock output by the switch and a delayed loop clock, and at least one delay element coupled to the output of the frequency adder to produce the delayed loop clock and the output clock.

Objects and advantages of the present invention include any of the foregoing, singly or in combination. Further objects and advantages will be apparent to those of ordinary skill in the art, or will be set forth in the following disclosure.

BRIEF DESCRIPTION OF THE DRAWINGS

The present invention is described with reference to the accompanying drawings. In the drawings, like reference numbers indicate identical or functionally similar elements.

FIG. 4b is a flow chart depicting an implementation of the method of FIG. 4a;

DETAILED DESCRIPTION OF PREFERRED EMBODIMENTS

Figure 3:
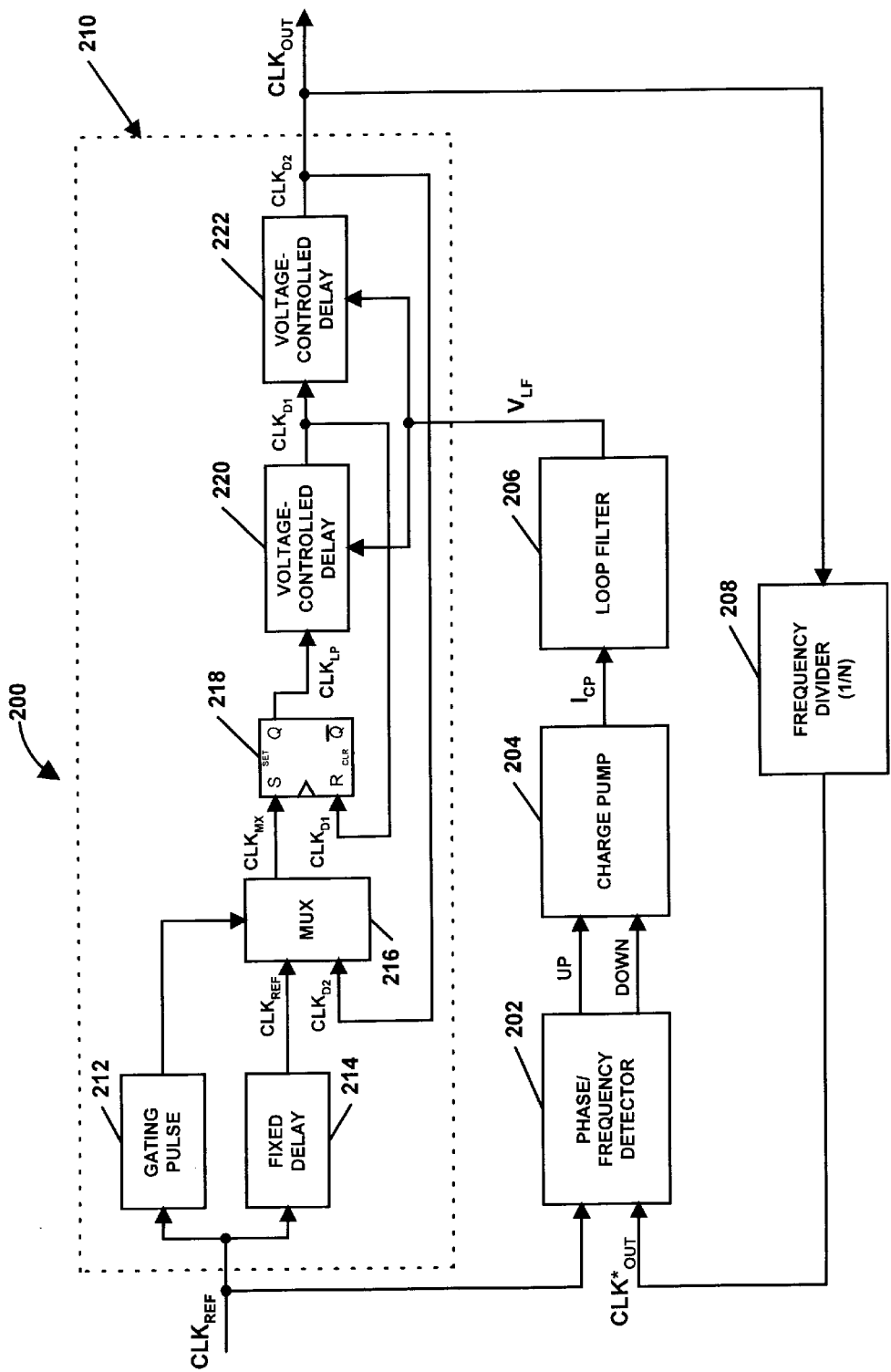
FIG. 3 is a detailed block diagram of a gated delay-locked loop according to the present invention.

A gated delay-locked loop (GDLL) 200 according to the present invention is illustrated in FIG. 3. GDLL 200, as will be described herein, provides superior noise performance and a lower noise accumulation factor compared to a PLL. It also provides frequency synthesis capability, wherein the frequency $F_{OUT}$ of the output clock is equal to the frequency $F_{ref}$ of the reference clock multiplied by an integer N.

An aspect of GDLL 200 is a delay-locked loop (DLL), which will now be described. A DLL generates an output clock signal that is delayed a predetermined amount of time relative to the input reference clock. The delay can be used to reduce the timing skew that develops between localized clock signals derived from a common reference signal. Signals that are distributed in a circuit or system do not typically arrive at all destination points simultaneously, resulting in timing skew. Timing skew can significantly affect performance in both board-based and integrated circuitry.

A delay-locked loop differs from a phase-locked loop in that in a voltage-controlled delay (VCD) is substituted for a voltage-controlled oscillator. Like a PLL, a DLL compares the phases of a reference clock signal and a feedback output clock signal. Based on this comparison, the VCD delay time is adjusted to synchronize the phase of the two signals.

Figure 1:
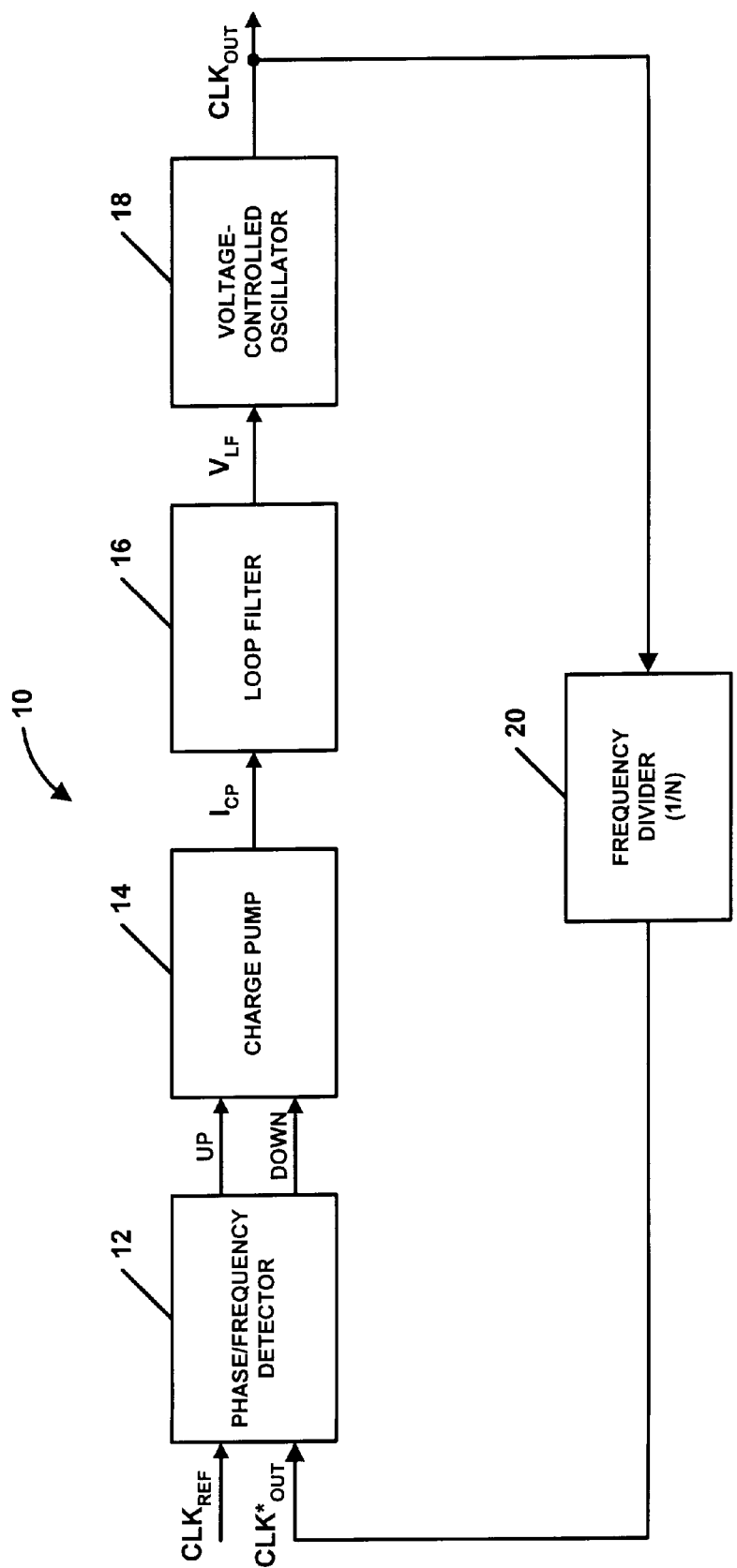
FIG. 1 is a block diagram illustrating the architecture of a typical phase-locked loop.
Figure 2:
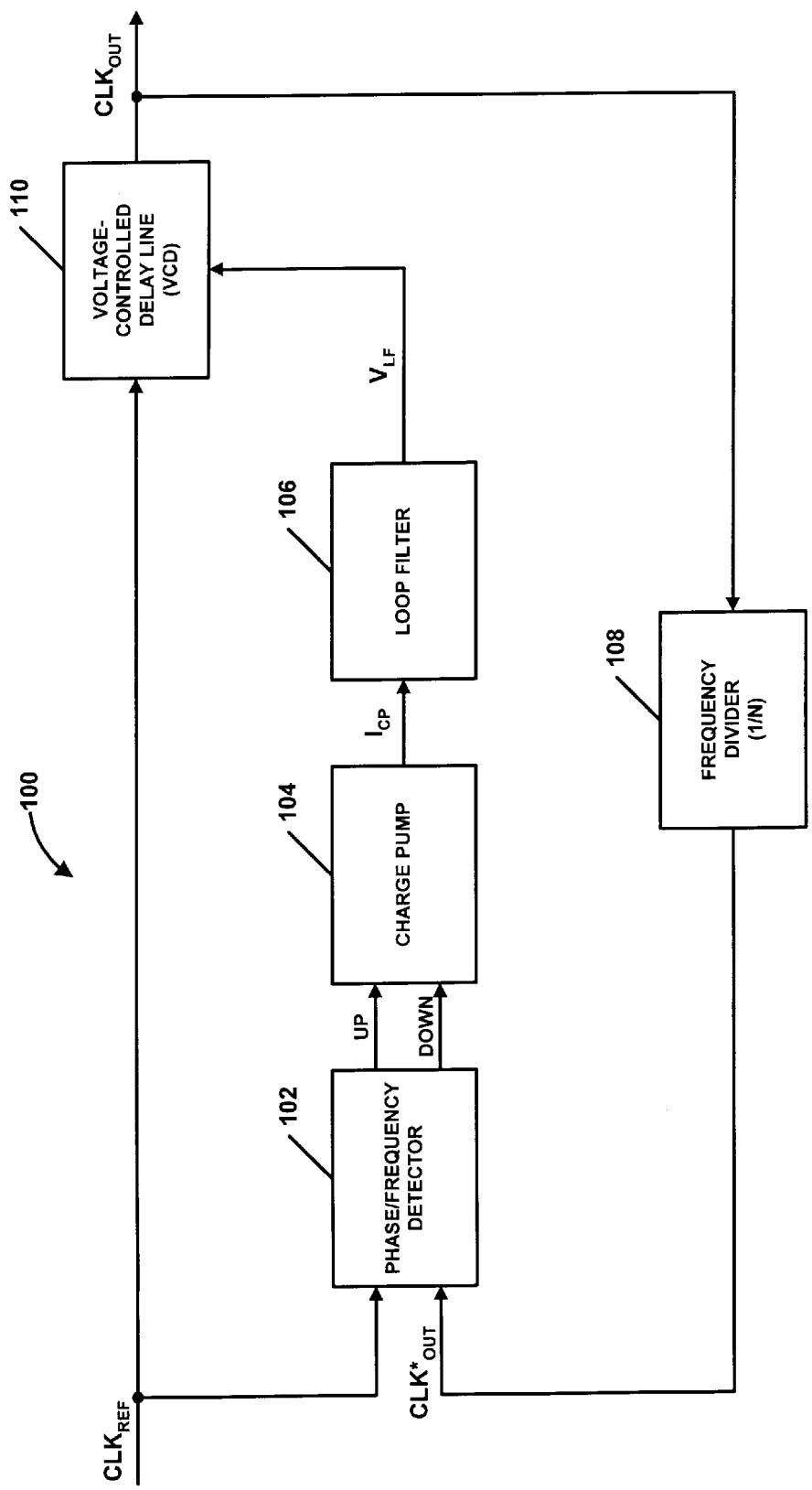
FIG. 2 is a block diagram illustrating the architecture of a delay-locked loop.

FIG. 2 is a block diagram illustrating the architecture of a delay-locked loop 100. A reference clock signal $CLK_{REF}$ having a frequency $F_{REF}$ is input to voltage-controlled delay line (VCD) 110 and phase detector 102. A divided-down version $CLK^*_{OUT}$ of the output clock signal $CLK_{OUT}$ is also supplied to phase detector 102. Detector 102 compares the phases of the two clock signals and generates an output signal commensurate with any phase differences that exist. If the reference clock signal leads the output clock signal, an "UP" signal directing charge pump 104 to increase the output current $I_{CP}$ is output by detector 102. Likewise, if the reference clock signal lags the output clock signal, a "DOWN" signal directing charge pump 104 to decrease $I_{CP}$ is output. If the signals are in phase, phase detector 102 asserts neither the UP nor the DOWN signal and charge pump 104 neither increases nor decreases $I_{CP}$.

The current $I_{CP}$ generated by charge pump 104 drives loop filter 106, which develops a control voltage $V_{LF}$ and supplies it to VCD 110. As described with reference to PLL 10, loop filter 106 is typically a simple low pass filter. VCD 110 adjusts the delay in an amount proportional to the voltage supplied by loop filter 106 or, if the output and reference clocks are in phase, maintains the current delay time. A clock signal $CLK_{OUT}$ having a frequency $F_{OUT}$ is output by VCD 110, and is also fed back to phase detector 102 via frequency divider 108 ($CLK^*_{OUT}$). In this manner, DLL 100 continually corrects any phase errors that develop between the reference and output clock signals.

The Laplace transform of the transfer function of DLL 100 can be expressed as:

$$\Theta_{out}-\Theta_{in}=\Theta_{del}(V);$$

where $\Theta_{out}$ is the phase of the output signal of the VCD, $\Theta_{in}$ is the phase of the input signal to the VCD, and V is the voltage applied to the control input of the VCD. Assuming $\Theta_{del}(V)=K_{del}V$, where $K_{del}$ is the gain of VCD 110; and $V=K_\Phi(\Theta_{out}-\Theta_{in}-2\pi N)Z(s)$, where $K_\Phi$ is the gain of phase detector 102, Z(s) is the transfer function of loop filter 106, and N is a positive integer representing the frequency division factor implemented through frequency divider 108, it follows that the transfer function of DLL 100 can be expressed as:

$$\Theta_{out} - \Theta_{in} = \frac{2\pi N \cdot K_{del} \cdot K_\phi \cdot Z(s)}{K_{del} \cdot K_\phi \cdot Z(s) - 1}$$

At steady state, and assuming $K_{del}$ and $K_\phi$ are much greater than one, the output phase can be expressed as:

$$\Theta_{out} = \Theta_{in} + 2\pi N$$

In terms of jitter or noise performance, DLLs employing voltage-controlled delay lines are superior to PLLs employing ring oscillators. Phase error is not accumulated over time since any jitter introduced by the VCD in a DLL is not passed on to the starting point of the next cycle since the delay line is not configured as an oscillator.

With reference to FIG. 3, GDLL 200 includes phase detector 202, charge pump 204, loop filter 206 and frequency divider 208. These elements are situated and function in a similar manner as the like elements of PLL 10 and DLL 100. Rather than a voltage-controlled oscillator or delay line, however, GDLL 200 employs a voltage-controlled gated oscillator (VCGO) 210.

A reference clock signal $CLK_{REF}$ having a frequency $F_{REF}$ is input to VCGO 210 and phase detector 202. The reference clock is derived from a source such as a crystal oscillator that, as will be understood by those of ordinary skill in the art, has a predetermined frequency $F_{REF}$ that is suitable for the particular implementation. VCGO 210 generates an output clock $CLK_{OUT}$ having a frequency $F_{OUT} = N \cdot F_{REF}$. A divided-down version $CLK^*_{OUT}$ of the output clock signal is supplied to the other input of phase detector 202. Detector 202 compares the phases of the two clock signals and generates an output signal indicative of any phase differences that exist. If the reference clock signal leads the output clock signal, an "UP" signal directing charge pump 204 to increase the output current $I_{CP}$ is output by detector 202. Likewise, if the reference clock signal lags the output clock signal, a "DOWN" signal directing charge pump 204 to decrease $I_{CP}$ is output. If the signals are in phase, phase detector 202 asserts neither the UP nor the DOWN signal and charge pump 204 neither increases nor decreases $I_{CP}$.

The current $I_{CP}$ generated by charge pump 204 drives loop filter 206, which filters and develops a voltage $V_{LF}$ that is applied to voltage-controlled delay elements 220 and 222 of VCGO 210. As described with reference to PLL 10 and DLL 100, loop filter 206 is typically a simple low pass filter. The delay time provided by VCDs 220 and 222 is adjusted in an amount proportional to $V_{LF}$ or, if the reference and output clock signals are in phase, the current delay time is maintained. A delayed output clock signal $CLK_{OUT}$, having a frequency $F_{OUT}$, is output by VCGO 210 and is also supplied to frequency divider 208 ($CLK^*_{OUT}$). Frequency divider 208 generates a divided frequency signal $CLK^*_{OUT}$ that is input to phase detector 202. In this manner, GDLL 200 continually corrects any phase errors that develop between the reference and output clock signals.

VCDs 220 and 222 produce, respectively, first delayed clock signal $CLK_{D1}$ and second delayed clock signal $CLK_{D2}$. Delayed clock signal $CLK_{D1}$ from VCD 220 is conveyed via a feedback loop to the R-input of S-R flip-flop 218, and delayed clock signal $CLK_{D2}$ from VCD 222 is conveyed via a feedback loop to multiplexer 216.

Multiplexer 216 has two data input lines and one data select line. One input line is connected to the reference clock signal $CLK_{REF}$ (delayed by fixed delay 214), and the other input line is connected to the second delayed clock signal $CLK_{D2}$ from VCD 222 (which is also the output clock signal $CLK_{OUT}$). The data select line is operated by gating pulse 212, causing multiplexer 216 to output a clock signal $CLK_{MX}$ to the S-input of S-R flip-flop 218. When gating pulse 212 is applied to multiplexer 216 (once each reference clock period, as will be described below), multiplexer 216 selects and outputs the reference clock signal $CLK_{REF}$ to the S input of S-R flip-flop 218. When gating pulse 212 is not applied, multiplexer 216 selects and outputs the second delayed clock signal $CLK_{D2}$ to the S input of S-R flip-flop 218. The R input of S-R flip-flop 218 is coupled to the first delayed clock signal $CLK_{D1}$ from VCD 220.

S-R flip-flop 218 derives a "loop clock" $CLK_{LP}$ from its S and R inputs. The output loop clock $CLK_{LP}$ from S-R flip-flop 218 is connected to the input of VCD 220. The delayed clock $CLK_{D1}$ output by VCD 220 is connected in serial fashion to the input of VCD 222, which outputs a second delayed clock $CLK_{D2}$. The output of VCD 222 is also the output clock $CLK_{OUT}$ of GDLL 220 and has a frequency $F_{OUT} = N \cdot F_{REF}$.

Figure 4A:
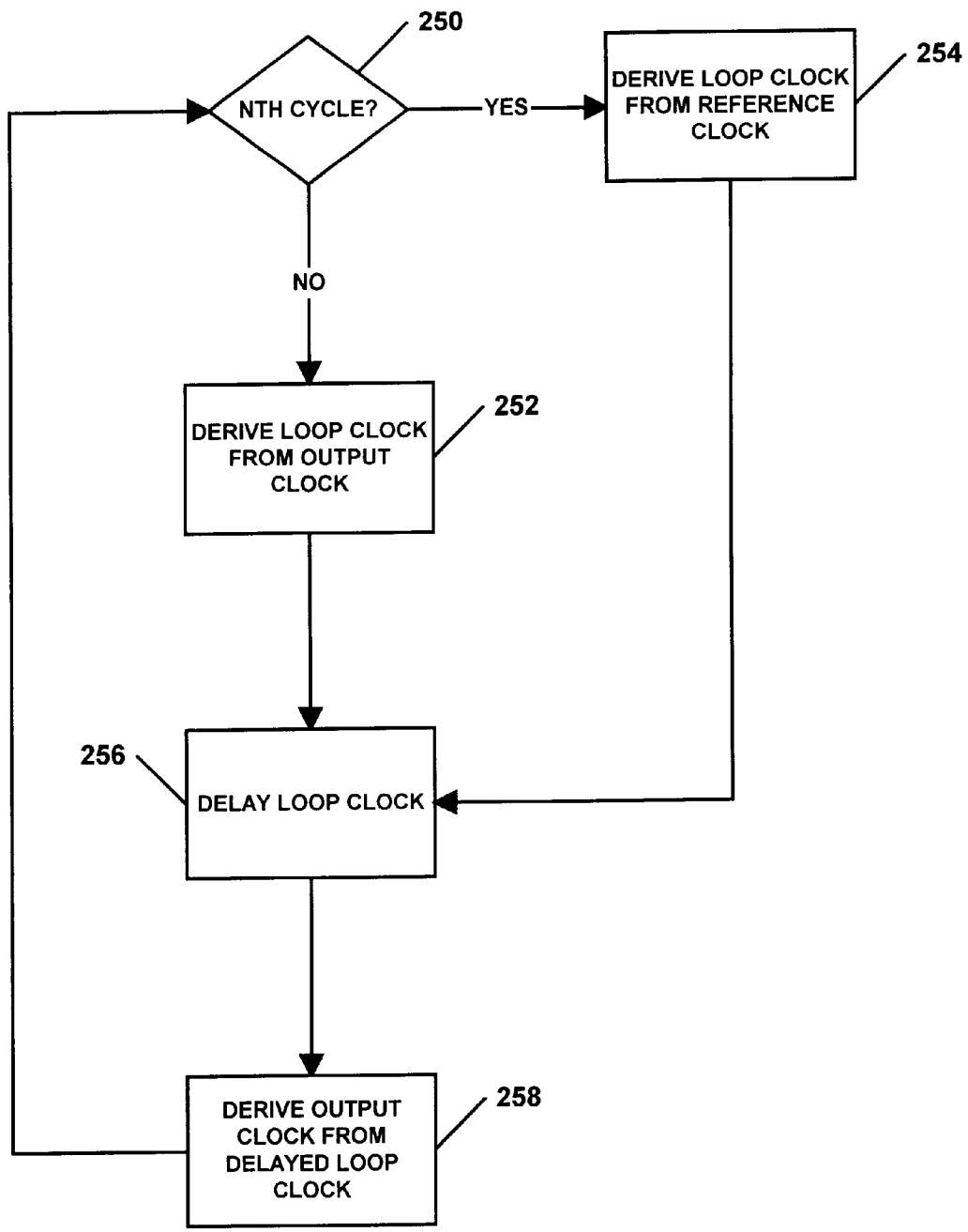
FIG. 4a is a flow chart illustrating the method by which the gated delay-locked loop of FIG. 3 derives an output clock from a reference clock.

The operation of VCGO 210 is first described conceptually with reference to FIG. 4a, which is a flowchart illustrating generally a method by which the output clock $CLK_{OUT}$ is derived from the reference clock $CLK_{REF}$. In the following description, a cycle is defined as one period of the output clock signal $CLK_{OUT}$; hence, one period T of the reference clock $CLK_{REF}$ corresponds to N cycles of the output clock $CLK_{OUT}$. Gating pulse 212 is applied once every N cycles (step 250). If the current cycle is other than the Nth cycle, the loop clock $CLK_{LP}$ output by S-R flip-flop 218 is derived from the output clock $CLK_{OUT}$ (step 252). If the current cycle is the Nth cycle, the loop clock $CLK_{LP}$ output by S-R flip-flop 218 is derived from the reference clock $CLK_{REF}$ (step 254).

The loop clock is then delayed by VCDs 220 and 222 for a total delay of $$\frac{1}{N \cdot F_{REF}}$$

(step 256). Hence, each VCD introduces a delay time $$T_{del}(V) = \frac{1}{2 \cdot N \cdot F_{REF}},$$

in which V is the control voltage applied to the VCDs, typically by a loop filter. More generally, if M delay elements are used, and each delay element contributes an equal delay time, the control voltage adjusts itself so that $$T_{del}(V) = \frac{1}{M \cdot N \cdot F_{REF}}.$$

The output clock $CLK_{OUT}$ is derived from the delayed loop clock (step 258).

The frequency of the output clock can be expressed in terms of the delay time as follows:

$$F_{OUT} = \frac{1}{M \cdot T_{del}(V)};$$

where M is a positive integer representing the number of delay elements. The frequency of the output clock can also be expressed in terms of the frequency of the reference clock:

$$F_{OUT} = N \cdot F_{REF};$$

where N is positive integer representing the number of cycles in the output clock signal. Hence, the output frequency is programmable through the setting of N.

Figure 4B:
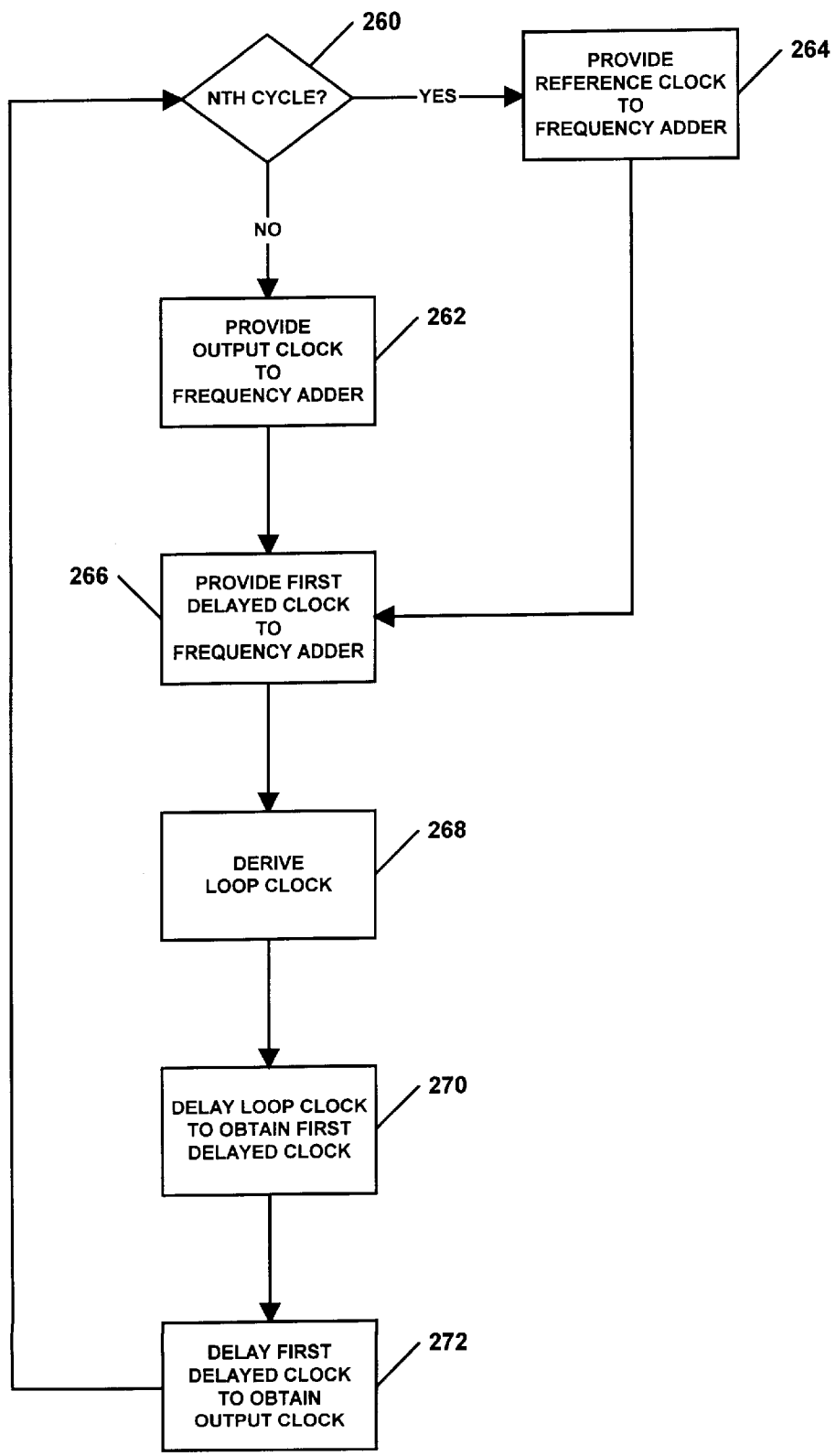
Figure 5:
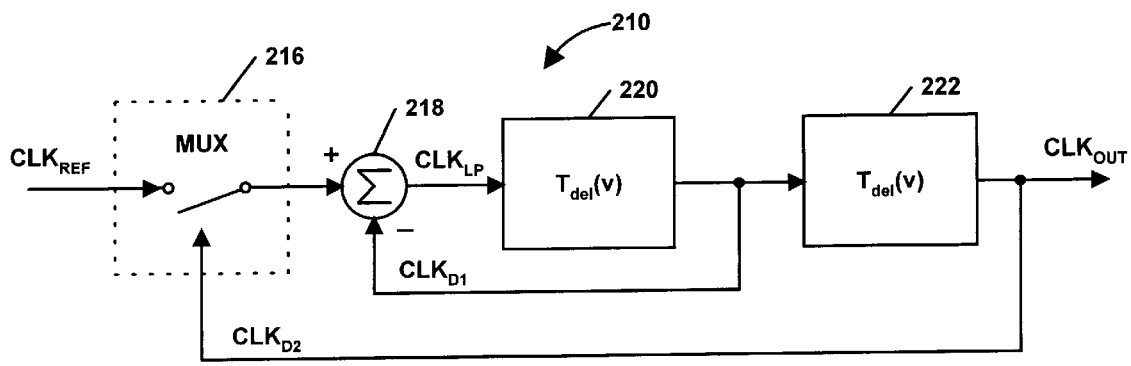
FIG. 5 is a block diagram showing operation of a voltage-controlled gated oscillator according to the present invention.

The operation of VCGO 210 is now described in more detail with reference to FIG. 4b, which is a flowchart illustrating an implementation of a method by which the output clock $CLK_{OUT}$ is derived from the reference clock $CLK_{REF}$, and FIG. 5, which is a block diagram of VCGO 210. As indicated in FIG. 5, multiplexer 216 operates as a switch controlled by gating pulse 212. A gating pulse is generated once every N cycles of the output clock signal (step 260). Fixed delay 214 is interposed between the reference clock input and multiplexer 216 in order to provide multiplexer 216 with sufficient time to switch states after receipt of the gating pulse. In response to the gating pulse, multiplexer 216 provides the reference clock $CLK_{REF}$ to the S input of the S-R flip-flop (step 264). The rising edge of the output clock signal $CLK_{OUT}$ is thus synchronized with the rising edge of the reference clock signal $CLK_{REF}$ once every N cycles, or once every reference clock period T.

Once the rising edge of the output clock signal has been synchronized with the rising edge of the reference clock signal, multiplexer 216 connects the output of VCD 222 ($CLK_{OUT}$ or $CLK_{D2}$) to the S input of S-R flip-flop 218 (step 262). Hence, the noise accumulation is limited to N−1 cycles, after which the noise-free reference clock signal is reintroduced. Since a "clean" reference clock is provided once every Nth cycle, there is essentially no memory in the VCGO, and the noise accumulated is much less than that accumulated by ring oscillators. Moreover, unlike in a ring oscillator, the initial phase of VCGO 210 is predefined by the input reference frequency.

Referring again to FIG. 5, it can be seen that S-R flip-flop 218 operates as a frequency adder. Either the output clock signal $CLK_{OUT}$ or the reference clock signal $CLK_{REF}$ is received on one input of the adder, as described above, and the first delayed clock signal $CLK_{D1}$ is received on the other adder input (step 266). This ensures that rising transitions in the output of VCD 220 cause rising transitions in the output of S-R flip-flop 218, and that rising transitions in the output of VCD 222 cause falling transitions in the output of S-R flip-flop 218. The result is that the frequency of the loop clock signal $CLK_{LP}$ output by the S-R flip-flop is derived from the frequency of the rising transitions of the output of VCD 220 and the frequency of the falling transitions of the output of VCD 222 (step 268).

The loop clock $CLK_{LP}$ derived by S-R flip-flop 218 is then delayed by VCD 220 for a delay time $$T_{del}(V) = \frac{1}{2 \cdot N \cdot F_{REF}},$$

in which V is the control voltage applied to VCD 220, to obtain the first delayed clock $CLK_{D1}$. $CLK_{D1}$ is provided to the R input of flip-flop 218, and is input to VCD 222. VCD 222 contributes an additional delay $$T_{del}(V) = \frac{1}{2 \cdot N \cdot F_{REF}}$$

to produce a second delayed clock signal $CLK_{D2}$ which is also the output clock $CLK_{OUT}$. As indicated above, the frequency of the output clock can be expressed as:

$$F_{OUT} = \frac{1}{M \cdot T_{del}(V)} = N \cdot F_{REF}.$$

Figure 6:
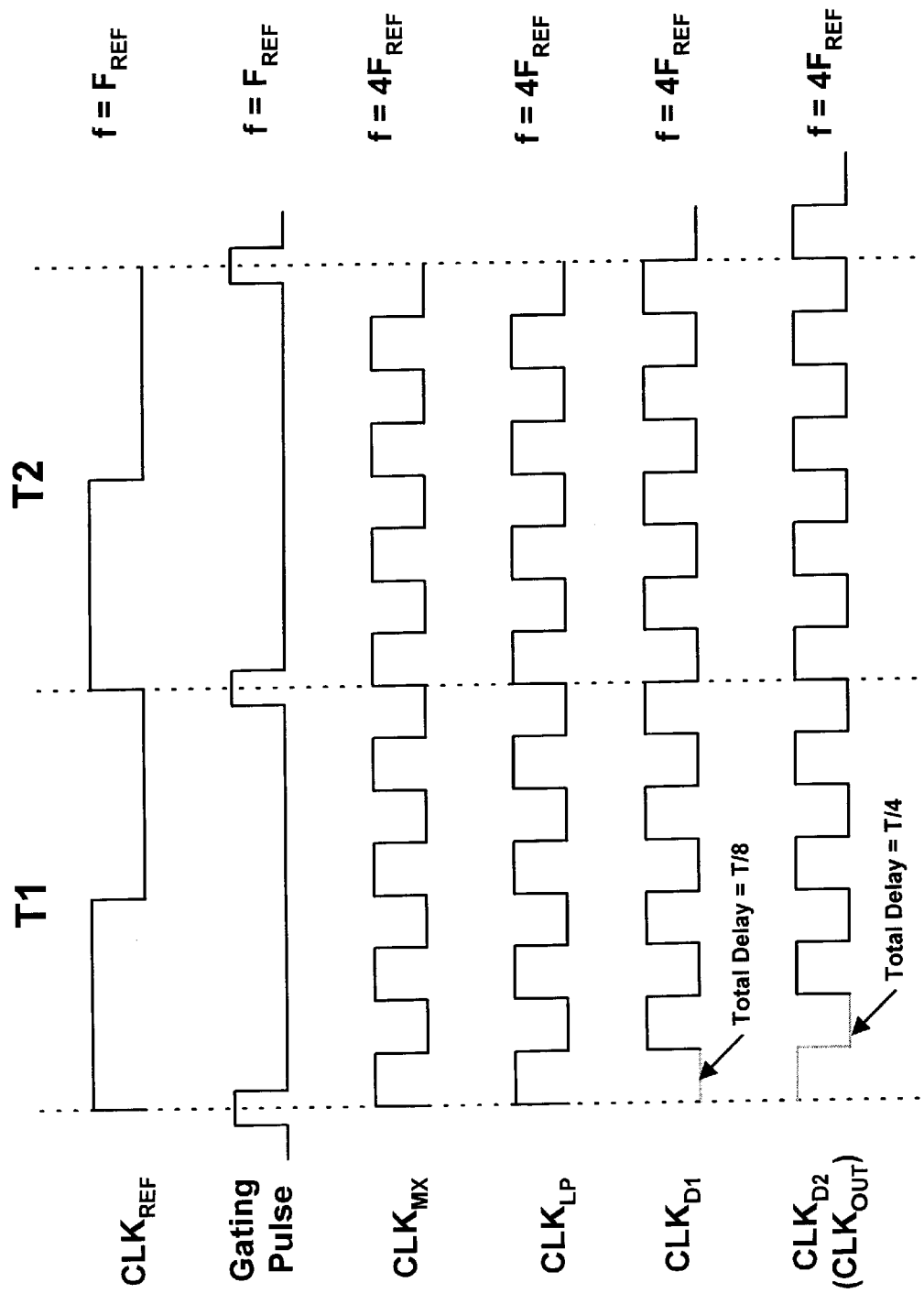
FIG. 6 is a timing diagram illustrating waveforms at various points in the gated delay-locked loop of FIG. 3

FIG. 6 is a timing diagram illustrating various clock waveforms in an example implementation of VCGO 210 in which N=4 and $F_{OUT}$=4·$F_{REF}$. The waveforms are illustrated over two reference clock periods T1 and T2, each having a period T. The reference clock waveform, $CLK_{REF}$, has a period T and a frequency $$F_{REF} = \frac{1}{T}.$$

The gating pulse is applied to the multiplexer once every N cycles of the output clock signal $CLK_{OUT}$ on the rising edge of $CLK_{REF}$ and, hence, also has a frequency $$F_{REF} = \frac{1}{T}.$$

The clock $CLK_{MUX}$ output by multiplexer 216 and the loop clock $CLK_{LP}$ output by S-R flip-flop 218 each have a frequency N·$F_{REF}$.

The output waveform of VCD 220 is designated $CLK_{D1}$. VCD 220 introduces a delay equal to one-eighth of the reference clock period T. Hence, $$T_{del}(V) = \frac{T}{8} = \frac{1}{8 \cdot F_{REF}}.$$

The output waveform of VCD 222 is designated $CLK_{D2}$, which is also the output clock signal $CLK_{OUT}$. VCD 222 also introduces a delay in an amount equal to one-eighth of the reference clock period T. Again, $$T_{del}(V) = \frac{1}{8 \cdot F_{REF}}.$$

Thus, the total delay introduced by VCDs 220 and 222 is one-fourth of the reference clock period T, or $$\frac{1}{4 \cdot F_{REF}}.$$

The frequency of the output clock signal $CLK_{OUT}$ is derived as:

$$F_{OUT} = \frac{1}{2 \cdot T_{del}(V)} = \frac{1}{2\left(\frac{1}{8 \cdot F_{REF}}\right)} = 4 \cdot F_{REF}.$$

The noise contribution of VCGO 210 can be expressed as:

$$\sqrt{\Theta_{out}^2(nT)} = \sqrt{\frac{1-(1-\varepsilon)^{2N}}{1-(2-\varepsilon)^2}} \cdot \frac{2\pi\Delta t}{T} = \alpha \cdot \frac{2\pi\Delta t}{T};$$

where $$\alpha = \sqrt{\frac{1-(1-\varepsilon)^{2N}}{1-(2-\varepsilon)^2}}$$

is the noise accumulation factor, N is the frequency division factor, and $$\varepsilon = \frac{\omega_L}{\omega_{REF}}$$

is the ratio of the loop bandwidth to the reference frequency, as described in relation to PLL 10.

Figure 7:
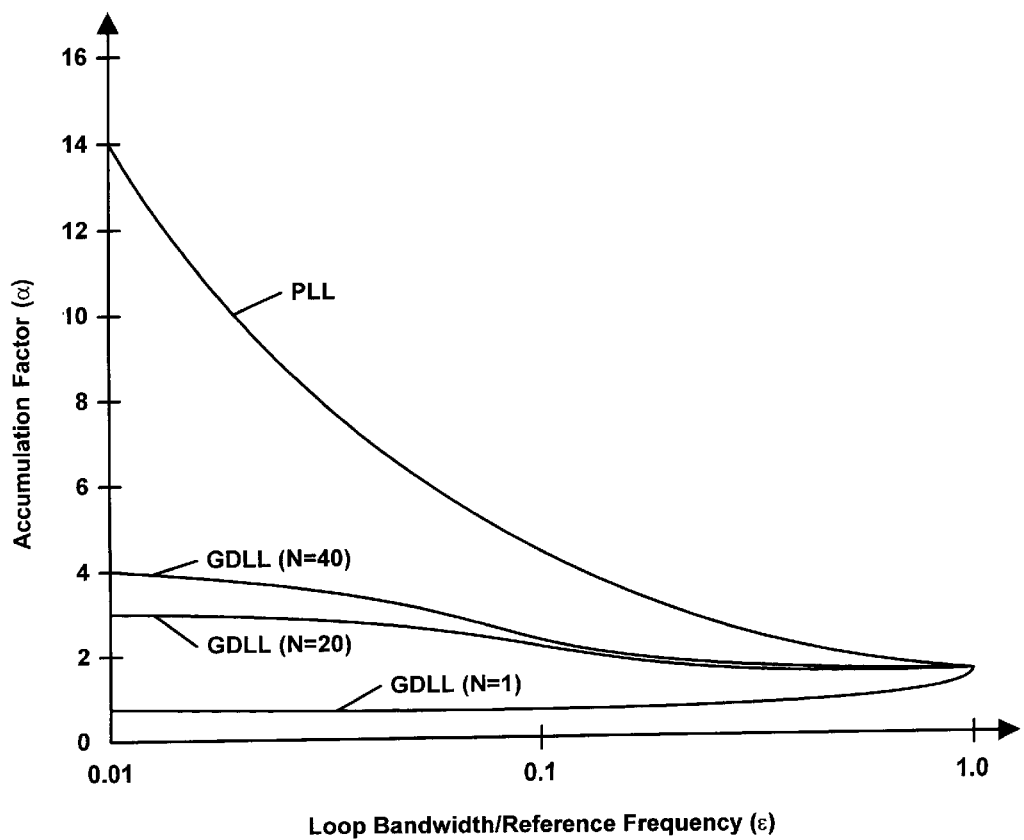
FIG. 7 is a graph plotting the noise accumulation factor as a function of the loop bandwidth/reference frequency for a typical phase-locked loop and the gated delay-locked loop according to the present invention.

In FIG. 7, the noise accumulation factor α for GDLL 200 is plotted vs. the loop bandwidth/reference frequency ratio ε for N=1, N=20 and N=40. It can be seen that the noise performance exhibited by GDLL 200 is superior to that provided by PLL 10 for all values of N, with the noise accumulation factor decreasing as N and ε decrease.

The transfer function of GDLL 200 can be expressed as:

$$\frac{\Theta_{out}}{N} - \Theta_{in} - \Theta_{fix} = \Theta_{del}(V);$$

where $\Theta_{out}$ is the phase of the output signal, $\Theta_{in}$ is the phase of the input signal, and $\Theta_{fix}$ is the sum of the delays imposed by frequency divider 208 and fixed delay 214. Since $\Theta_{del}$(V)=$K_{del}$·V, where $K_{del}$ is the gain of VCDs 220 and 222, and since V=$K_\Phi$($\Theta_{out}$−$\Theta_{in}$−2πN)Z(s), where $K_\Phi$ is the gain of phase detector 202, Z(s) is the transfer function of loop filter 206, and N is a positive integer representing the frequency division factor, it follows that the transfer function of GDLL 200 can be expressed as:

$$\frac{\Theta_{out}}{N} - \Theta_{in} = \frac{2\pi N \cdot K_{del} \cdot K_\Phi \cdot Z(s)}{K_{del} \cdot K_\Phi \cdot Z(s) - 1} + \frac{\Phi_{fix}}{K_{del} \cdot K_\Phi \cdot Z(s) - 1}$$

In order for GDLL 200 to remain stable, $\Theta_{fix}$ should have a value of 0, ±2π or ±N·2π.

Figure 8:
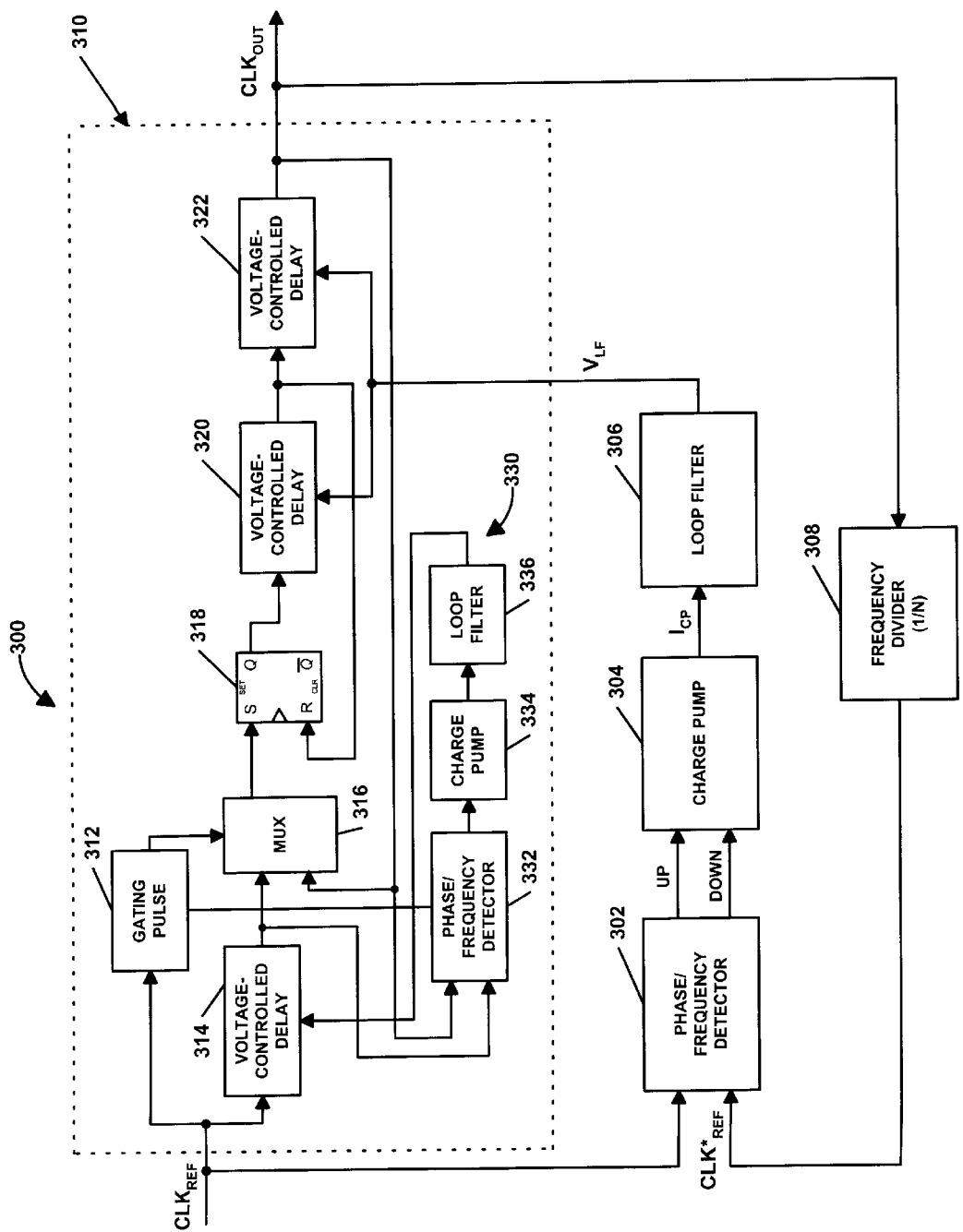
FIG. 8 is a detailed block diagram showing an alternate embodiment of a gated delay-locked loop according to the present invention.

FIG. 8 illustrates an alternate implementation of a gated delay-locked loop according to the present invention. GDLL 300 has a configuration that assures that $\Theta_{fix}$ will remain at a constant value of 0, ±2π or ±N·2π. Recall that $\Theta_{fix}$ is the sum of the delays introduced by frequency divider 208 and fixed delay 214. Maintaining $\Theta_{fix}$ at a constant value can be problematic since the delay contributed by frequency divider 308 may vary. To resolve this problem, GDLL 300 utilizes a voltage-controlled delay 314 rather than a fixed delay. Voltage-controlled delay 314 is adjusted as necessary by a second delay-locked loop 330 to maintain a constant $\Theta_{fix}$. Delay-locked loop 330 receives the delayed reference clock signal and the output clock signal at the inputs of phase detector 332, and applies a control voltage via charge pump 334 and loop filter 336 to voltage-controlled delay 314 that adjusts the delay as necessary. Importantly, second loop 330 operates much quicker than main loop 300 and hence does not itself contribute any destabilizing delay.

While particular embodiments of the present invention have been described above, it should be understood that they have been presented by way of example only, and not as limitations. The breadth and scope of the present invention is defined by the following claims and their equivalents, and is not limited by the particular embodiments, implementations or implementation examples described herein.

What is claimed is:

1. A gated delay-locked loop that receives a reference clock having a frequency $F_{REF}$ and generates an output clock having a frequency $F_{OUT}$=N·$F_{REF}$ that is synchronized in phase with the reference clock, the gated delay-locked loop comprising:

a gated oscillator including at least one delay element configured in a feedback loop that introduces a time delay $T_{del}$ to produce a delayed clock, the delay element having an input, said gated oscillator further including a multiplexer responsive to a gating pulse that selectively applies either a clock derived from the delayed clock or the reference clock to the feedback loop; and a phase comparator for comparing the phase of a clock derived from the output clock to the phase of the reference clock and adjusting the time delay introduced by the at least one delay element to correct any detected phase difference;

wherein the gating pulse is applied to the multiplexer once every N cycles of the output clock to cause the multiplexer to select the reference clock for supply to the feedback loop, and wherein the multiplexer selects the output clock for supply to the feedback loop the remaining N−1 cycles.

2. A gated delay-locked loop that receives a reference clock having a frequency $F_{REF}$ and generates an output clock having a frequency $F_{OUT}$=N·$F_{REF}$ that is synchronized in phase with the reference clock, the gated delay-locked loop composing:

a gated oscillator including at least one delay element configured in a feedback loop that introduces a time delay $T_{del}$ to produce a delayed clock, the delay element having an input, said gated oscillator further including a multiplexer responsive to a gating pulse that selectively applies either a clock derived from the delayed clock or the reference clock to the feedback loop;

a phase comparator for comparing the phase of a clock derived from the output clock to the phase of the reference clock and adjusting the time delay introduced by the at least one delay element to correct any detected phase difference;

a first delay element that generates a first delayed clock coupled to a second delay element that generates the output clock, the output clock being coupled to said multiplexer; and a frequency adder coupled to the output of the multiplexer that adds the first delayed clock and either the reference clock or the output clock to derive a loop clock, and wherein the loop clock is coupled to the input of the first delay element.

3. A gated delay-locked loop as claimed in claim 2, wherein the frequency adder comprises an S-R flip-flop that receives the multiplexer output on its S input and the first delayed clock on its R input, and wherein the loop clock that is output by the S-R flip-flop is coupled to the input of the first delay element.

4. A gated delay-locked loop that receives a reference clock having a frequency $F_{REF}$ and generates an output clock having a frequency $F_{OUT}$=N·$F_{REF}$ that is synchronized in phase with the reference clock, the gated delay-locked loop comprising:

a gated oscillator including at least one delay element configured in a feedback loop that introduces a time delay $T_{del}$ to produce a delayed clock, the delay element having an input, said gated oscillator further including a multiplexer responsive to a gating pulse that selectively applies either a clock derived from the delayed clock or the reference clock to the feedback loop;

a phase comparator for comparing the phase of a clock derived from the output clock to the phase of the reference clock and adjusting the time delay introduced by the at least one delay element to correct any detected phase difference; and a first delay element that generates a first delayed clock coupled to a second delay element that generates the output clock, the output clock being coupled to said multiplexer;

wherein the first and second delay elements are controlled by a voltage generated by the phase comparator, and wherein the gating pulse is applied to the multiplexer once every N cycles of the output clock to cause the multiplexer to select the reference clock for supply to the feedback loop, and wherein the multiplexer selects the output clock for supply to the feedback loop the remaining N−1 cycles.

5. A gated delay-locked loop as claimed in claim 4, wherein the frequency $F_{OUT}$ of the output clock is a function of the delay time $T_{del}(V)$ of the voltage-controlled delay elements, and wherein the voltage-controlled delay elements are digitally-programmable to set the delay time $T_{del}(V)$.

6. A gated delay-locked loop as claimed in claim 5, wherein $$F_{OUT} = \frac{1}{2 \cdot T_{del}(V)} \text{ and } T_{del}(V) = \frac{1}{2 \cdot N \cdot F_{REF}}.$$

7. A gated delay-locked loop that receives a reference clock having a frequency $F_{REF}$ and generates an output clock having a frequency $F_{OUT}=N \cdot F_{REF}$ that is synchronized in phase with the reference clock, the gated delay-locked loop comprising:

a gated oscillator including at least one delay element configured in a feedback loop that introduces a time delay $T_{del}$ to produce a delayed clock, the delay element having an input, said gated oscillator further including a switch responsive to a gating signal that selectively applies either a clock derived from the delayed clock or the reference clock to the feedback loop; and a phase comparator for comparing the phase of a clock derived from the output clock to the phase of the reference clock and adjusting the time delay introduced by the at least one delay element to correct any detected phase difference;

wherein the loop has a noise accumulation factor $$\alpha = \sqrt{\frac{1-(1-\varepsilon)^{2N}}{1-(2-\varepsilon)^2}},$$

wherein N is a positive integer and $$\varepsilon = \frac{\omega_L}{\omega_{REF}}$$

is the ratio of the loop bandwidth to the frequency of the reference clock.

8. A gated delay-locked loop that receives a reference clock having a frequency $F_{REF}$ and generates an output clock having a frequency $F_{OUT}=N \cdot F_{REF}$ that is synchronized in phase with the reference clock, the gated delay-locked loop comprising:

a gated oscillator including at least one delay element configured in a feedback loop that introduces a time delay $T_{del}$ to produce a delayed clock, the delay element having an input, said gated oscillator further including a multiplexer responsive to a gating pulse that selectively applies either a clock derived from the delayed clock or the reference clock to the feedback loop;

a phase comparator for comparing the phase of a clock derived from the output clock to the phase of the reference clock and adjusting the time delay introduced by the at least one delay element to correct any detected phase difference;

a first delay element that generates a first delayed clock coupled to a second delay element that generates the output clock, the output clock being coupled to said multiplexer; and a third delay element interposed between the multiplexer and the reference clock;

wherein the third delay element is a fixed delay element that provides the multiplexer with sufficient time to switch states.

9. A gated delay-locked loop as claimed in claim 8, wherein the noise transfer function of the loop is expressed as:

$$\frac{\Theta_{out}}{N} - \Theta_{in} = \frac{2\pi N \cdot K_{del} \cdot K_\Phi \cdot Z(s)}{K_{del} \cdot K_\Phi \cdot Z(s)-1} + \frac{\Theta_{fix}}{K_{del} \cdot K_\Phi \cdot Z(s)-1};$$

wherein $\Theta_{out}$ is the phase of the output clock, $\Theta_{in}$ is the phase of the reference clock, N is a positive integer, $K_{del}$ is the gain of the first and second delay elements, $K_\Phi$ is the gain of the phase detector, Z(s) is the transfer function of the loop filter, and $\Theta_{fix}$ is equal to the sum of the delays imposed by the third delay element and a frequency divider positioned between the output clock and its input to the phase detector.

10. A gated delay-locked loop as claimed in claim 9, wherein $\Theta_{fix}$ has a constant value of $\pm M \cdot 2\pi$, where M is an integer greater than or equal to zero.

11. A gated delay-locked loop as claimed in claim 10, wherein the third delay element is a voltage-controlled delay element that is controlled by a voltage generated by a second delay-locked loop in order to maintain a constant $\Theta_{fix}$.

12. A method for generating an output clock having an output frequency $F_{OUT}$ equal to an integer N multiplied by a reference frequency $F_{REF}$ of a reference clock, the output clock having N cycles per cycle of the reference clock, the method comprising:

(a) determining a current cycle of the output clock;

(b) deriving a loop clock from the output clock if the current cycle is other than the Nth cycle;

(c) deriving a loop clock from the reference clock if the current cycle is the Nth cycle;

(d) delaying the loop clock;

(e) deriving the output clock from the delayed loop clock;

(f) incrementing the current cycle; and (g) repeating the method from step (a).

13. A method as claimed in claim 12, wherein in step (d), the loop clock is delayed M times by M delay elements, each delay element introducing a delay $$T_{del} = \frac{1}{M \cdot N \cdot F_{REF}} \text{ for a total delay of } \frac{1}{N \cdot F_{REF}}.$$

14. A method as claimed in claim 13, wherein in step (d), the loop clock is delayed twice to create a first delayed loop clock and the output clock.

15. A method as claimed in claim 14, wherein in step (b), the loop clock is derived from the output clock and the first delayed clock.

16. A method as claimed in claim 15, wherein in step (c), the loop clock is derived from the reference clock and the first delayed clock.

17. A method as claimed in claim 16, wherein in steps (b) and (c), the loop clock is derived by an S-R flip-flop that receives the output clock or the reference clock on its S input and the first delayed clock on its R input.

18. A method as claimed in 12, wherein in steps (a)–(c), the presence of a gating pulse signals the Nth cycle.

19. A method as claimed in claim 18, wherein the gating pulse is applied to a data select line of a multiplexer.

20. A method as claimed in claim 19, wherein the multiplexer receives the reference clock signal and output clock signal as inputs.

21. A method as claimed in claim 12, wherein in step (d), the delay time is controlled by a voltage corresponding to phase differences between the reference clock and output clock.

22. A method for generating an output clock having an output frequency $F_{OUT}$ equal to an integer N multiplied by a reference frequency $F_{REF}$ of a reference clock, the output clock having N cycles per cycle of the reference clock, the method comprising:

(a) determining a current cycle of the output clock;

(b) providing the output clock to a frequency adder if the current cycle is other than the Nth cycle;

(c) providing the reference clock to the frequency adder if the current cycle is the Nth cycle;

(d) providing a delayed loop clock to the frequency adder;

(e) deriving the loop clock from the delayed loop clock and either the output clock or the reference clock;

(f) delaying the loop clock to obtain the delayed loop clock;

(g) delaying the delayed loop clock to obtain the output clock;

(h) incrementing the current cycle; and (i) repeating the method from step (a).

23. A method as claimed in claim 22, wherein the frequency adder is an S-R flip-flop that receives the output clock or the reference clock on its S input and the delayed loop clock on its R input.

24. A gated oscillator that receives a reference clock having a frequency $F_{REF}$ and generates an output clock having a frequency $F_{OUT}=N \cdot F_{REF}$ that is synchronized in phase with the reference clock, the oscillator comprising:

a switch that is responsive to a gating signal to switch between the reference clock and the output clock;

a frequency adder coupled to the output of the switch that derives a loop clock from the clock output by the switch and a delayed loop clock; and at least one delay element coupled to the output of the frequency adder to produce the delayed loop clock and the output clock.

25. A gated oscillator as claimed in claim 24, wherein there is a first delay element that generates the delayed loop clock coupled to a second delay element that generates the output clock, the output clock being coupled to the switch and the delayed loop clock being coupled to the frequency adder.

26. A gated oscillator as claimed in claim 24, wherein the switch comprises a multiplexer that receives the reference clock and the output clock as inputs and that is responsive to the gating signal to provide either the reference clock or the output clock to the frequency adder.

27. A gated oscillator as claimed in claim 26, wherein the gating signal is applied to the multiplexer once every N cycles of the output clock to cause the multiplexer to provide the reference clock to the frequency adder, and wherein the multiplexer provides the output clock to the frequency adder the remaining N−1 cycles.

28. A gated oscillator as claimed in claim 24, wherein the frequency adder comprises an S-R flip-flop that receives the switch output on its S input and the delayed loop clock on its R input, and wherein the loop clock that is output by the S-R flip-flop is coupled to the at least one delay element.

29. A gated delay-locked loop as claimed in claim 24, wherein the at least one delay element is controlled by a voltage indicative of any phase differences between the reference and output clocks.

* * * * *